United States Patent
Kim et al.

[11] Patent Number: 6,147,745
[45] Date of Patent: Nov. 14, 2000

[54] EXPOSURE APPARATUS

[75] Inventors: Yong-ki Kim, Sungham; Deok-yong Ko, Suwon; Joong-yeon Jeong; Hyung-seok Lee, both of Seoul; Yeon-wook Jung, Euijungbu, all of Rep. of Korea

[73] Assignee: Samsung Aerospace Industries, Ltd., Kyongsangnam-do, Rep. of Korea

[21] Appl. No.: 09/192,233

[22] Filed: Nov. 16, 1998

[30] Foreign Application Priority Data

Nov. 15, 1997 [KR] Rep. of Korea ............... 97/60204

[51] Int. Cl.$^7$ .................... G03B 27/54; G03B 27/42
[52] U.S. Cl. ............................ 355/67; 355/53
[58] Field of Search .................. 355/30, 53, 67, 355/72, 73; 250/492.2, 492.22, 548; 356/399–401

[56] References Cited

U.S. PATENT DOCUMENTS

| | | | |
|---|---|---|---|
| 4,676,630 | 6/1987 | Matsushita et al. | 355/53 |
| 4,712,910 | 12/1987 | Sakato | 355/53 |
| 4,758,863 | 7/1988 | Nikkle | 355/40 |
| 5,187,519 | 2/1993 | Takabayashi et al. | 355/53 |
| 5,446,519 | 8/1995 | Makinouchi | 355/53 |
| 5,508,518 | 4/1996 | Kendall | 250/492.2 |
| 5,610,686 | 3/1997 | Osanai | 355/72 |
| 5,712,698 | 1/1998 | Poschenrieder et al. | 355/71 |
| 5,721,608 | 2/1998 | Taniguchi | 355/53 |
| 5,781,277 | 7/1998 | Iwamoto | 355/53 |
| 5,854,671 | 12/1998 | Nishi | 355/53 |
| 5,864,389 | 1/1999 | Osanai et al. | 355/53 |
| 5,883,701 | 3/1999 | Hasegawa et al. | 355/53 |
| 5,917,580 | 6/1999 | Ebinuma et al. | 355/55 |

FOREIGN PATENT DOCUMENTS 2299867  10/1996  United Kingdom.

*Primary Examiner*—Russell Adams
*Assistant Examiner*—Hung Henry Nguyen
*Attorney, Agent, or Firm*—Finnegan, Henderson, Farabow, Garrett, & Dunner, L.L.P.

[57] ABSTRACT

An exposure apparatus includes a frame member with a first stage having a substrate disposed thereon provided in a lower portion of the frame member. A leveling mechanism is provided for adjusting an orientation of the first stage. The exposure apparatus further includes a second stage positioned over the first stage and fixed to the frame member. A reticle is positioned on the second stage. An exposure area limiting mechanism is provided in the exposure apparatus and positioned over the second stage. The exposure area limiting mechanism defines an opening through which light is capable of passing during exposure for limiting an exposure area of the second stage. The exposure apparatus also includes an illumination system to irradiate light to the exposure area limiting means. The illumination system includes a shutter and an exposure sensor for sensing an amount of light that will exit the illumination system, wherein the shutter is controlled in response to the exposure sensor to control the amount of light exiting the illumination system to the exposure area limiting mechanism. A detecting mechanism for detecting alignment of the first and second stages also is provided in the exposure apparatus.

28 Claims, 5 Drawing Sheets

EXPOSURE APPARATUS

BACKGROUND OF THE INVENTION

1. Field of the Invention

The present invention relates to an exposure apparatus.

2. Description of the Related Art

In fabricating a semiconductor memory device, a flat panel display device such as a liquid crystal display device or a plasma display device, a printed circuit board, a filter and other elements using thin film technology, a photolithographic etching method for forming a fine pattern is used. The photolithographic etching method necessitates an exposure apparatus for transferring patterns of a reticle or a mask onto a photosensitive film formed on a substrate.

An example of this exposure apparatus is schematically illustrated in FIG. 1, and includes a reticle stage 18 on which a reticle 500 having a predetermined pattern drawn thereon or a mask is placed, and a plate stage 19 on which a substrate 600 where the pattern of the reticle 500 is to be formed is placed. An alignment optical system 21 for alignment of the reticle 500 is provided in the reticle stage 18.

Light emitted from a light source is directed to a dichroic mirror 12, and light having a specific wavelength is reflected from the dichroic mirror 12.

Light reflected from the dichroic mirror 12 passes through a filter 15 and a fly's eye lens 16 to become a point light source and is directed to a focusing lens 13 via a shutter 17 and a reflection mirror 14.

Light having passed through the focusing lens 13 is projected onto the reticle 500, and passes through a projection optical system 22 to be irradiated onto the substrate 600, thereby exposing a photosensitive film made of a photosensitive material and formed on the substrate 600 in a predetermined pattern.

An automatic focusing controller 23 is provided in the plate stage 19 so that the light having passed through the projection optical system 22 is accurately focused on the substrate 600.

When exposure is made using the above-described conventional exposure apparatus, the exposure pattern of a large-scale panel may be distorted and some parts of a substrate may not be exposed. Also, since the large-sized exposure apparatus is mounted on a light frame, the exposure apparatus may vibrate due to an externally applied minor shock, which impairs exposure reliability and stability.

SUMMARY OF THE INVENTION

The advantages and purpose of the invention will be set forth in part in the description which follows, and in part will be obvious from the description, or may be learned by practice of the invention. The advantages and purpose of the invention will be realized and attained by means of the elements and combinations particularly pointed out in the appended claims.

To attain the advantages and in accordance with the purpose of the invention, as embodied and broadly described herein, and to solve the above-listed problems, it is an objective of the present invention to provide an exposure apparatus which has a simplified structure, is capable of attaining exposure of a large substrate, and can improve the exposure precision using a reticle.

Accordingly, to achieve the above objective, there is provided an exposure apparatus including a supporting frame, a frame member supported on the supporting frame, a base member provided in the lower portion of the frame member, a first stage positioned on the base member and suspended from the frame member by an elastic member, leveling means provided between the base member and the first stage, for adjusting orientation of the first stage with respect to the base member, a second stage positioned over the first stage and fixed to the frame member, exposure area limiting means positioned over the second stage, for limiting an exposure area, light irradiating means for irradiating light into the first stage via the exposure area limiting means and the second stage, and detecting means for detecting alignment of the first and second stages.

An elastic member for relieving shock is interposed between the supporting frame and the frame member. In addition, the supporting frame and the frame member are made of stone.

The leveling means comprises a lever having one end pivotally connected to the base member, an actuator for elevating the other end of the lever, a supporting member interposed between a top surface of the lever and a bottom surface of the first stage, and a sensor interposed between the lever and the base member. The leveling means determines the position of the first inductor with respect to the optical axis, and ensures that the top surface of the first inductor is correctly aligned with the optical axis.

At least one of the first and second stages comprises a linear motor for effecting coplanar x-axis and y-axis directional movement of the at least one of the first and second stages.

The first and second stages each comprise a stator suspended from the frame member by the elastic member, and an inductor positioned over the stator, supported by an air bearing, and having a substrate mounting portion on its top surface.

The exposure area limiting means comprises a panel member supported on the frame member, the panel member having a penetration portion through which light passes, and a plurality of blinders slidably provided in the panel member by transferring means, for defining an opening width of the penetration portion.

The light irradiating means comprises an illumination system for emitting light to the exposure area limiting means, an intermediate optical system, positioned between the exposure area limiting means and the second stage, for directing the light which passes through the exposure area limiting means toward a reticle positioned on the second stage, and a projection optical system for irradiating the light which passes through the reticle onto a substrate positioned on the first stage.

The illumination system comprises a hollow housing fixed on the frame member, a light source provided in the housing, a dichroic mirror for reflecting light of a specific wavelength which is emitted from the light source, a shutter provided along a light travel path between the light source and the dichroic mirror, and a lens group having a fly's eye lens provided along the light travel path between the light source and the dichroic mirror.

The intermediate optical system comprises a first reflection member positioned over the second stage and having a first reflection surface from which the light reflected from the dichroic mirror is reflected, and a second reflection surface disposed at a predetermined angle with respect to the first reflection surface, and A lens group for directing the light reflected from the first reflection surface toward the second reflection surface. The light reflected from the second reflection surface is directed toward the reticle positioned on the second stage.

The projection optical system comprises a second reflection member having a third reflection surface from which the image-projected light, reflected from the second reflection surface and having passed through the reticle, is reflected, and a fourth reflection surface disposed at a predetermined angle with respect to the third reflection surface, and a lens group for directing the light reflected from the third reflection surface toward the fourth reflection surface. The light reflected from the fourth reflection surface is incident into the substrate positioned on the first stage.

The detecting means comprises a laser head provided in the frame member, for emitting laser beams, first and second mirrors for x-axis and y-axis measurement, fixed to two adjacent sides of the first stage, respectively, first interferometers provided to face the first and second mirrors, respectively, third and fourth mirrors for x-axis and y-axis measurement, fixed to two adjacent sides of the second stage, respectively, and second interferometers provided to face the third and fourth mirrors, respectively.

There may further be provided a light travel path converting means for transmitting the light emitted from the laser head to the first and second interferometers, provided along a light travel path between the laser head and the first and second interferometers.

It is to be understood that both the foregoing general description and the following detailed description are exemplary and explanatory only and are not restrictive of the invention, as claimed.

BRIEF DESCRIPTION OF THE DRAWINGS

The above objective and advantages of the present invention will become more apparent by describing in detail a preferred embodiment of the present invention, with reference to the attached drawings, which are incorporated in and constitute a part of this specification. In the drawings.

DESCRIPTION OF THE PREFERRED EMBODIMENTS

Figure 1:
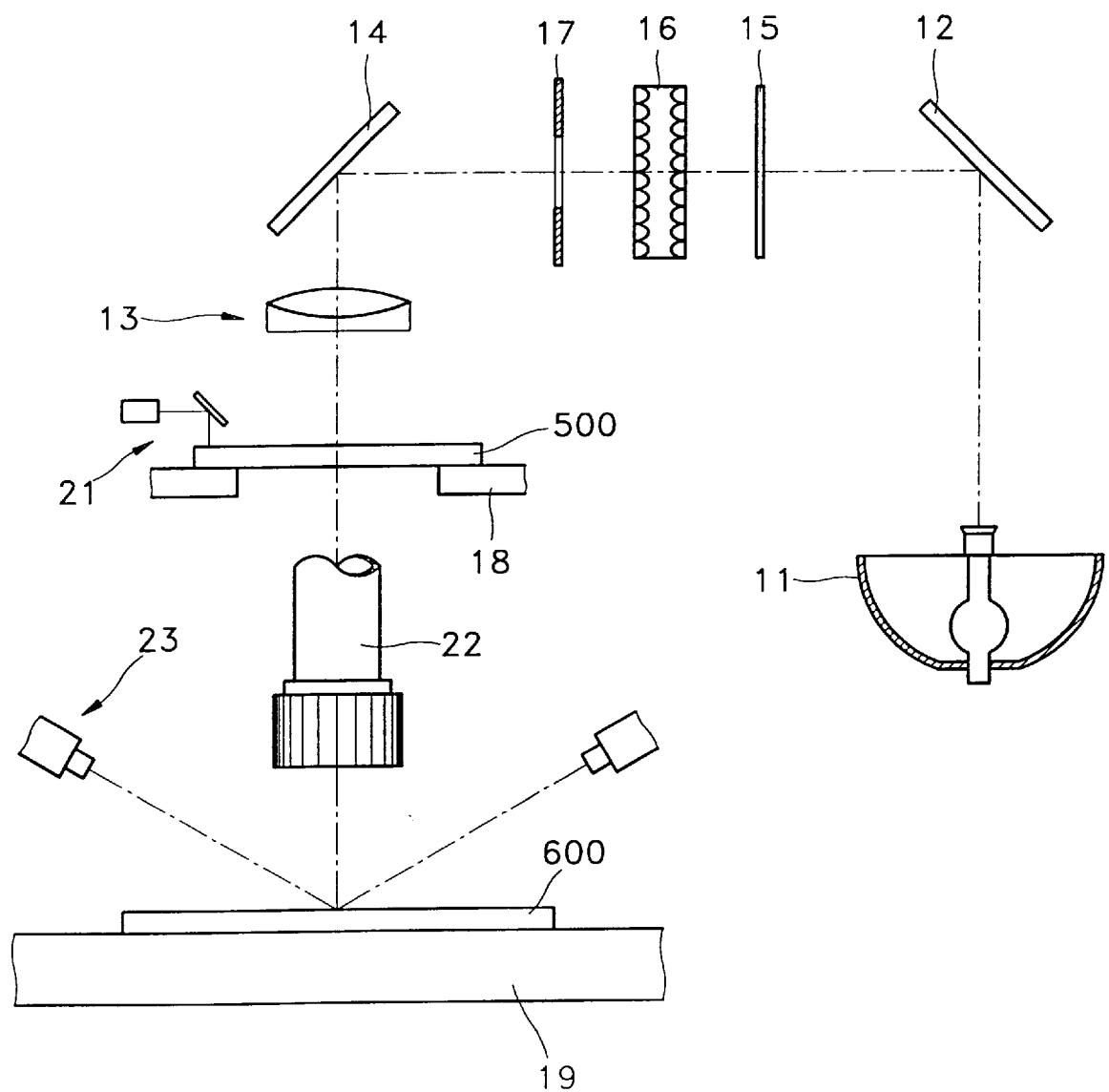
FIG. 1 is a schematic diagram illustrating the arrangement of a conventional exposure apparatus.
Figure 2:
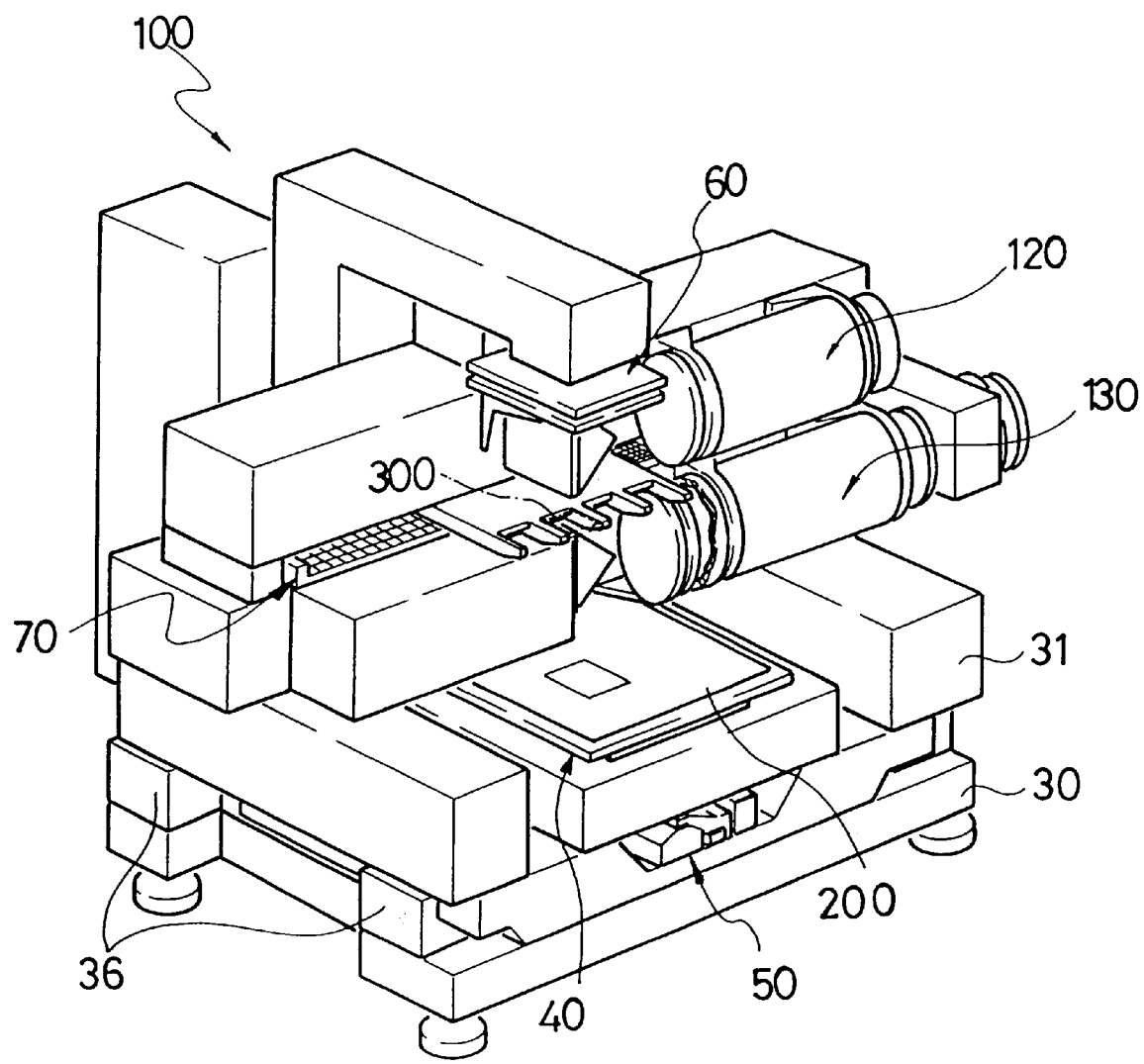
FIG. 2 is a perspective view of an exposure apparatus according to the present invention.
Figure 3:
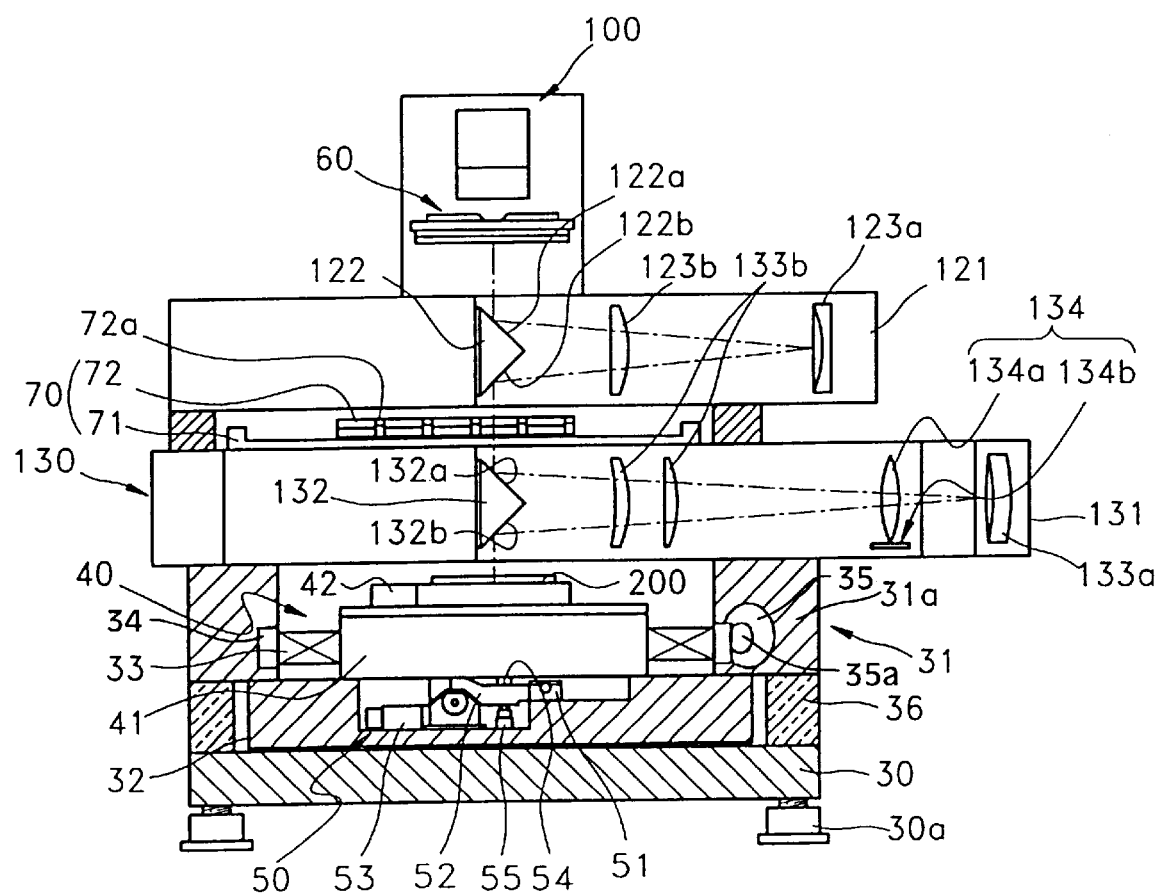
FIG. 3 is a cross-sectional view schematically illustrating the arrangement of the exposure apparatus according to the present invention.
Figure 4:
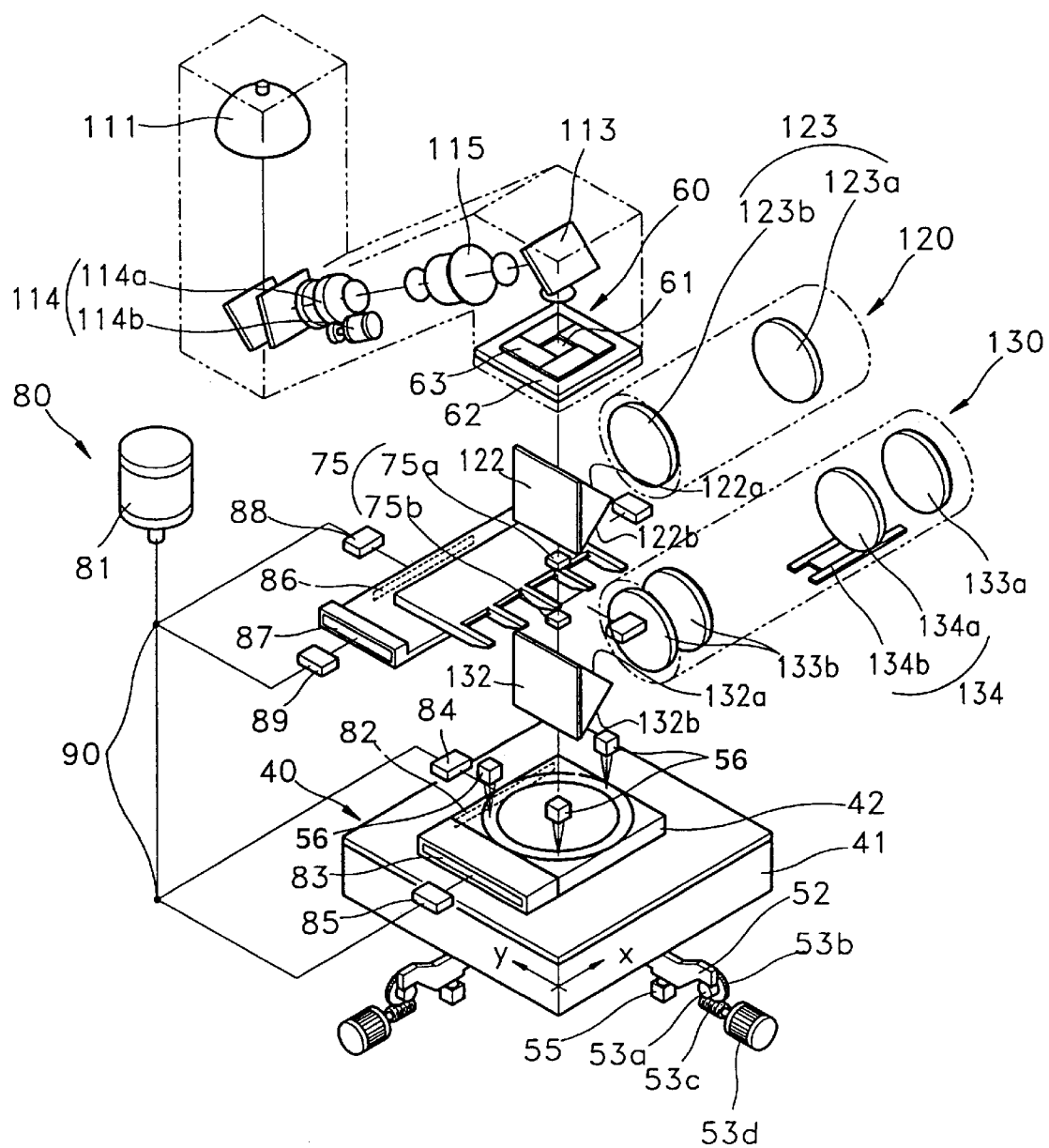
FIG. 4 is a perspective view schematically illustrating parts of the exposure apparatus according to the present invention.

Reference will now be made in detail to the present preferred embodiment of the invention, an example of which is illustrated in the accompanying drawings. Wherever possible, the same reference numbers will be used throughout the drawings to refer to the same or like parts.

An exposure apparatus according to the present invention transfers patterns of a reticle or a mask onto a photosensitive film of a substrate, and a preferred embodiment thereof is shown in FIGS. 2 through 5.

As shown, the exposure apparatus according to the present invention includes a supporting frame 30, a frame member 31 supported on the supporting frame 30, and a base member 32 provided in the frame member 31.

A first stage 40 supported on the frame member 31 by at least one elastic member 33 is positioned over the base member 32. A leveling means 50 for elevating the first stage 40 and maintaining the leveling means 50 parallel to the base member 32 is provided between the base member 32 and the first stage 40.

A second stage 70 is fixed to the frame member 31, and an exposure area limiting means 60 for limiting the exposure area is provided on the second stage 70.

The exposure apparatus includes light irradiating means 100 for irradiating a light onto the first stage 40 through the exposure area limiting means 60 and the second stage 70, and a detecting means 80 for detecting the alignment state of the first and second stages 40 and 70.

The supporting frame 30 and the frame member 31 are made of a stone such as granite, and a plurality of legs 30a for supporting the supporting frame 30 and the frame member 31 are threaded on the bottom surface of the supporting frame 30 so that the balance of the supporting frame 30 can be adjusted according to their installation place.

A supporting portion 31a of the frame member 31 is supported to the periphery of the supporting frame 30, and a shock absorbing member 36 such as a panel-shaped rubber elastic member, for absorbing shock, particularly shock applied from the supporting frame 30 to the frame member 31, is provided between the supporting portion 31a and the supporting frame 30. The shock absorbing member 36 is not restricted to the panel-shaped rubber elastic member, and may include any unit that has a damping capability and absorbs vibration.

The first stage 40 is constituted by a linear motor movable in coplanar x-axis and y-axis directions and having a first stator 41 and a first inductor 42. The first stator 41 is suspended from the frame member 31, at three points, by the at least one elastic member 33. The first stator 41 is made of panel-shaped granite, a magnetic iron panel is attached thereon to form a pole having a lattice shape arranged in x-axis and y-directions. An electromagnetic module having a pole formed in the x-axis and y-axis directions and to which an electric control signal is applied so as to be movable with respect to the first stator 41 in the x-axis and y-axis directions, is provided on the bottom surface of the first inductor 42 positioned on the first stator 41.

A substrate 200, to be exposed to light, is mounted on a mounting portion on the first inductor 42. An air pressure supply means (not shown) is provided between the first inductor 42 and the first stator 41 to provide an air bearing for lifting the first inductor 42, so that the first inductor 42 is subject to only a small amount of friction. The first stage 40 rotates with respect to the frame member 31 while contacting a collar 34 to which rotational force is transferred from a driving source 35 through a transfer gear 35a. Alternatively, the first stage can be rotated by a conventional driving mechanism, for example, a motor whose rotating shaft is connected to the first stage 40.

The leveling means 50 adjusts the orientation of the first stage 40 with respect to the base member 32, and adjusts the focusing of the light irradiated on the substrate 200 by the light irradiating means 100.

The leveling means 50 includes levers 52 whose one ends are hinged to at least three protrusions 51 protruding from the base member 32, an actuator 53 provided in the base member 32 for elevating the other ends of the respective levers 52, a support member 54 such as a ball joint positioned between the levers 52 and the first stator 41, and a sensor 55 positioned between the respective levers 52 and the base member 32 for detecting the amount of elevation of the lever 52.

The actuator 53 includes an eccentric cam 53*a* contacting the other ends of the levers 52, a worm wheel 53*b* provided coaxially with the eccentric cam 53*a*, a worm 53*c* meshed with the worm wheel 53*b*, and a motor 53*d* for driving the worm 53*c*. The leveling means 50 and the actuator 53 are not restricted to those described above, and may include any structure that can the orientation of the first stage 40 with respect to the base member 32.

The leveling means 50 comprises an auto-focusing means, and is controlled by signals sent from the auto-focusing means for sensing whether light irradiated on the substrate 200 is focused. Leveling means 50 is also controlled by signals sent from the lever elevation sensor 55.

The auto-focusing means includes a sensing means. The sensing means includes three sensors 56 mounted on inductor 42. One sensor senses an optical axis of a projection optical system to be described later, and the other sensors 56 sense the periphery of the top surface of the first inductor 42. During exposure, all three of the sensors 56 operate to determine the position of the first inductor 42 with respect to the optical axis. If all three sensors 56 sense the same position of the first inductor with respect to the optical axis, it is determined that the first inductor 42 is correctly aligned with the optical axis. If the three sensors sense a different position of the first inductor with respect to the optical axis, it is determined that the first inductor 42 is not correctly aligned with the optical axis. If first inductor 42 is not correctly aligned with the optical axis, the leveling means 50 is activated, based upon readings of the three sensors 56 of the auto-focus means, to align the top surface of the first inductor 42 correctly with the optical axis.

The second stage 70, provided directly over the first stage 40, supports the reticle 300 and employs a linear motor having the same structure as the linear motor of the first stage 40. The linear motor of the second stage 70 includes a second stator 71 fixed to the frame member 31, and a second inductor 72 positioned on the second stator 71. A plurality of individual pockets 72*a*, in which the reticle 300 is placed, are formed in the second inductor 72. The sizes of the pockets 72*a* are different from one another and are constructed to mount different types of reticles therein.

Installation of the reticle 300 on the second inductor 72 is performed by vacuum adsorption. In other words, an adsorption hole (not shown) is formed at the periphery of the pockets 72*a* and is connected to a conventional vacuum pump for vacuum pressure to be applied thereto.

A reticle alignment means 75 is provided on the second stage 70. The reticle alignment means 75 includes a light emitting element 75*a* for irradiating light toward a mark marked on the reticle (e.g., a cross-shaped mark), and a light receiving element 75*b* having a mark of a predetermined pattern for sensing the reticle mark.

Figure 5:
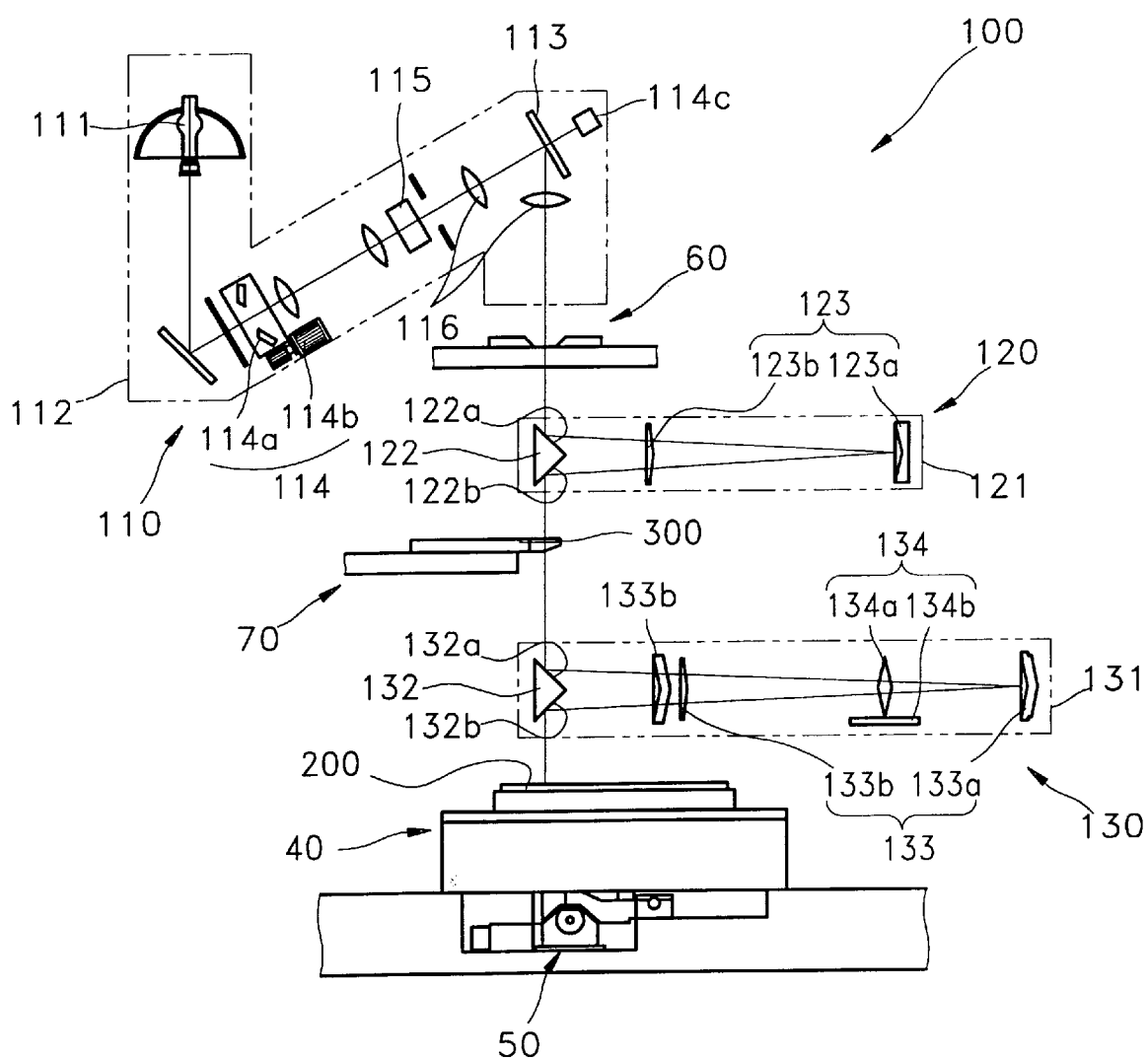
FIG. 5 is a cross-sectional view illustrating an optical system of the exposure apparatus according to the present invention.

The light irradiating means 100 includes an illumination system 110 having a light source 111, an intermediate optical system 120 for irradiating the light emitted from the illumination system 110 onto the reticle 300 supported on the second stage 70, and a projection optical system 130 for irradiating the light incident from the intermediate optical system 120 onto a photosensitive film of the substrate 200 supported on the first stage 40, as shown in FIG. 5. The longitudinal axes of the intermediate optical system 120 and the projection optical system 130 extend substantially parallel to the top surface of one of the first stage and the second stage.

The illumination system 110 includes a hollow housing 112 fixed on the frame member 31. A dichroic mirror 113 for reflecting the light of a specific wavelength toward the second stage 70 is provided at one end of the housing 112, and the light source 111 is provided at the other end of the housing 112. A shutter 114, a fly's eye lens 115 and a plurality of lenses are sequentially disposed along a light travel path between the light source 111 and the dichroic mirror 113.

The shutter 114 controls the amount of light passing therethrough, and includes a shutter blade 114*a* provided along the light travel path so as to be rotatable by a motor 114*b* in the housing 112, and an integrating exposure sensor 114*c* for sensing the amount of light of predetermined wavelengths transmitting the dichroic mirror 113. The integrating exposure sensor 114*c* senses the amount of light of predetermined wavelengths transmitting the dichroic mirror 113. Based upon the amount of light of predetermined wavelengths transmitting the dichroic mirror 113, the motor 114*b* rotates the shutter blade 114*a* until the amount of light of predetermined wavelengths transmitting the dichroic mirror 113 is at a desirable level. The integrating exposure sensor 114*c* may be provided at any place where the amount of light can be sensed, i.e., in front of or behind the dichroic mirror 113.

The intermediate optical system 120 includes a housing 121 positioned above the second stage 70. Within the housing 121, there are provided a first reflection member 122 having a first reflection surface 122*a* on which the light reflected from the dichroic mirror 113 is reflected and a second reflection surface 122*b* disposed at a predetermined angle with respect to the first reflection surface 122*a*. There is also provided a first lens group 123 for directing the light reflected from the first reflection surface 122*a* toward the second reflection surface 122*b*.

The first lens group 123 includes a first reflection lens 123*a* for reflecting the light reflected from the first reflection surface 122*a* to the second reflection surface 122*b*, and an adapter lens 123*b* for focusing the light incident from the first reflection surface 122*a* to the first reflection lens 123*a* and focusing the light reflected from the first reflection lens 123*a* to the second reflection surface 122*b*. The light reflected from the second reflection surface 122*b* is irradiated onto the reticle 300 positioned on the second stage 70.

The projection optical system 130 irradiates the light reflected from the first reflection member 122 onto the photosensitive film of the substrate 200 positioned on the first inductor 42 of the first stage 40.

The projection optical system 130 includes a housing 131 positioned over the first stage 40. Within the housing 131, there is provided a second reflection member 132 having a third reflection surface 132*a* on which the image-projected light, reflected from the second reflection surface 122*b* and having passed through the reticle 300, is reflected, and a fourth reflection surface 132*b* disposed at a predetermined angle with respect to the third reflection surface 132*a*. There is also provided a second lens group 133 for directing the light reflected from the third reflection surface 132*a* toward the fourth reflection surface 132*b*.

The second lens group 133 includes a second reflection lens 133*a* having a concave plane, for reflecting the light reflected from the third reflection surface 132*a* to the fourth reflection surface 132*b*, and lenses 133*b* provided between the second reflection lens 133a and the second reflection member 132, for focusing the light to the second reflection lens 133a. The light reflected by the second reflection member 132 is irradiated onto the substrate 200 on the first stage 40.

A magnification adjusting means 134 for adjusting the focusing length of the light irradiated onto the photosensitive film of the substrate 200 is provided between the second reflection lens 133a and the second reflection member 132. The magnification adjusting means 134 includes a magnification adjusting lens 134a provided along the light travel path, and a transferring means 134b for transferring the magnification adjusting lens 134a in the optical axis direction of the housing 131. The transferring means 134b includes a linear motor provided within the housing 131.

The exposure area limiting means 60 is provided between the illumination system 110 and the intermediate optical system 120 and limits the exposure area of the reticle 300. The exposure area limiting means 60 includes a panel member 62 positioned over the second stage 70 and having a penetration portion 61, and a plurality of blinders 63 slidably provided by a blinder transferring means (not shown), for defining an opening width of the penetration portion 61. Preferably, the blinders 63 are overlappingly arranged about the penetration portion 61.

As the blinder transferring means, a typical linear stepping motor is used. Ends of each of the blinders 63, at the sides of the penetration portion 61, are preferably tilted from the upper surface to the lower surface to have sloped inner walls which tapered toward penetration portion 61.

The detecting means 80 for detecting precise positions of the first and second inductors 42 and 72, includes a laser head 81 provided in the frame member 31, for emitting laser beams, first and second mirrors 82 and 83 for x-axis and y-axis measurement, fixed to two adjacent of the first inductor 42, respectively, and first interferometers 84 and 85 provided to face the first and second mirrors 82 and 83, respectively.

Also, the detecting means 80 includes third and fourth mirrors 86 and 87 for x-axis and y-axis measurement, fixed to two adjacent sides of the second inductor 72, respectively, and second interferometers 88 and 89 provided to face the third and fourth mirrors 86 and 87, respectively.

A light travel path converting means 90 for directing the light irradiated from the laser head 81 to first and second interferometers 84, 85 and 88, 89 is provided along the light travel path between the laser head 81 and the first and second interferometers 84, 85 and 88, 89. The light travel path converting means 90 may be formed of a combination of a general beam splitter and mirrors.

The operation of the exposure apparatus having the above-described configuration will now be described.

In order to expose the pattern of the reticle 300 on the photosensitive film of the substrate 200 using the exposure apparatus according to the present invention, the reticle 300 is mounted in the pockets 72a of the second inductor 72.

When the substrate 200 and the reticle 300 are completely mounted, the blinders 63 of the exposure area limiting means 60 are individually moved by a linear motor (not shown) to limit the exposure area.

Subsequently, the light irradiated from the light source 111, such as an ultra-high pressure mercury lamp, passes the shutter 114 and the fly's eye lens 115 to then be incident into the dichroic mirror 113. Here, heat components of the light irradiated from the light source 111 are removed while passing through a filter (not shown). The amount of light having passed through the shutter 114, the fly's eye lens 115 and the dichroic mirror 113 is sensed by the integrating exposure sensor 114c. The sensed amount of light is compared with a predetermined amount of light, and is controlled by rotating the shutter blade 114a using the motor 114b of the shutter 114.

During the above-described process, the light irradiated from the light source 111 becomes parallel light via the fly's eye lens 115 for making a point light source, and the parallel light is incident into the lenses 116.

The light having passed through the lenses 116 passes through the penetration portion 61, whose opening width is defined by the blinders 63 of the exposure area limiting means 60, to be incident into the first reflection member 122 of the intermediate optical system 120. Thus, the light reflected from the first reflection surface 122a of the first reflection member 122 passes through the adapter lens 123b, and then is reflected by the first reflection lens 123a to be incident into the second reflection surface 122b.

The light reflected from the second reflection surface 122b is incident into the projection optical system 130 to be sequentially reflected from the third reflection surface 132a of the second reflection member 132, the second reflection lens 133a of the second lens group 133, and the fourth reflection surface 132b. The light then projects on the substrate 200, thereby transferring the exposure pattern of the reticle 300 to the substrate 200.

Here, the magnification adjusting means 134 adjusts the magnification, by transferring the magnification adjusting lens 134a by means of the transferring means 134b, according to changes in substrate sizes due to thermal expansion of the substrate 200. In this case, the first inductor 42 is simultaneously driven for accurately adjusting the magnification.

While the invention has been described with reference to the illustrative embodiment, the invention is not limited to the disclosed embodiment but, on the contrary, is intended to cover various modifications and equivalents included within the spirit and scope of the invention. Priority application (Korea) 97-60204 filed on Nov. 15, 1997, including the specification, drawings, claims and abstract, is incorporated herein by reference.

What is claimed is:

1. An exposure apparatus comprising:

a frame member;

a first stage provided in a lower portion of the frame member;

a leveling mechanism configured to adjust an orientation of the first stage;

a second stage positioned over the first stage and fixed to the frame member;

an exposure area limiting mechanism positioned over the second stage, said exposure area limiting mechanism defining an opening through which light is capable of passing during exposure, said opening having an area for limiting an exposure area of the second stage;

an illuminating system configured to irradiate light to the exposure area limiting mechanism, said illumination system including a shutter and an exposure sensor for sensing an amount of light that will exit the illumination system, wherein the shutter is controlled in response to the exposure sensor to control the amount of light exiting the illumination system to the exposure area limiting mechanism; and a detecting mechanism configured to detect the alignment of the first and second stages;

wherein the leveling mechanism comprises:
- a level having one end pivotally connected to a base member that supports the first stage;
- an actuator for elevating the other end of the lever;
- a supporting member interposed between a top surface of the lever and a bottom surface of the first stage; and a sensor interposed between the lever and the base member, and wherein said leveling mechanism adjusts the orientation of the first stage with respect to the base member.

2. The exposure apparatus according to claim 1, further comprising:
- a supporting frame on which the frame member is provided; and
- an elastic member interposed between the supporting frame and the frame member.

3. The exposure apparatus according to claim 1, wherein the supporting frame and the frame member are made of stone.

4. The exposure apparatus according to claim 1, wherein the first stage includes a first inductor and the leveling mechanism includes an autofocus mechanism for determining the position of the first inductor with respect to an optical axis, and for ensuring that a top surface of the first inductor is correctly aligned with the optical axis.

5. The exposure apparatus according to claim 1, wherein at least one of the first and second stages comprises a linear motor for effecting coplanar x-axis and y-axis directional movement of the at least one of the first and second stages.

6. The exposure apparatus according to claim 5, wherein the first and second stages each comprise:
- a stator suspended from the frame member by an elastic member; and
- an inductor positioned over the stator, supported by an air bearing, and having a substrate portion on its top surface.

7. The exposure apparatus according to claim 1, further including a driving source for rotating the first stage with respect to the frame member.

8. The exposure apparatus according to claim 1, wherein the exposure area limiting mechanism comprises:
- a panel member supported on the frame member, the panel member having a penetration portion through which light passes; and
- a plurality of blinders slidably provided in the panel member, wherein said plurality of blinders define the opening through which light passes into the penetration portion.

9. The exposure apparatus according to claim 8, wherein the blinders are overlappingly arranged about the penetration portion.

10. The exposure apparatus according to claim 1, further comprising:
- an intermediate optical system, positioned between the exposure area limiting mechanism and the second stage, for directing the light which passes through the exposure area limiting mechanism toward a reticle positioned on the second stage; and
- a projection optical system for irradiating the light which passes through the reticle onto a substrate positioned on the first stage.

11. The exposure apparatus according to claim 10, wherein the illumination system further comprises:
- a hollow housing fixed on the frame member;
- a light source provided in the housing;
- a dichroic mirror for reflecting light of a specific wavelength which is emitted from the light source; and
- a lens group having a fly's eye lens provided along the light travel path between the light source and the dichroic mirror, wherein the shutter is provided along a light travel path between the light source and the dichroic mirror.

12. The exposure apparatus according to claim 1, wherein the shutter comprises:
- a shutter blade rotatably provided along a light travel path in the illumination system, for controlling an amount of light passing therethrough; and
- a motor for rotating the shutter blade;

wherein:
- the exposure sensor comprises an integrating exposure sensor for sensing an amount of light of predetermined wavelengths and
- the motor rotates the shutter blade, based upon an amount of light of predetermined wavelengths sensed by the integrating exposure sensor.

13. The exposure apparatus according to claim 10, wherein the intermediate optical system comprises:
- a first reflection member positioned over the second stage and having a first reflection surface from which the light passing through the exposure area limiting mechanism is reflected, and a second reflection surface disposed at a predetermined angle with respect to the first reflection surface; and
- a lens group for directing the light reflected from the first reflection surface toward the second reflection surface, wherein the light reflected from the second reflection surface is directed toward the reticle positioned on the second stage.

14. The exposure apparatus according to claim 13, wherein the lens group comprises:
- an adapter lens for focusing the light reflected from the first reflection surface; and
- a first reflection lens for reflecting the light having passed through the adapter lens toward the second reflection surface.

15. The exposure apparatus according to claim 13, wherein the projection optical system comprises:
- a second reflection member having a third reflection surface from which the image-projected light, reflected from the second reflection surface and having passed through the reticle, is reflected, and a fourth reflection surface disposed at a predetermined angle with respect to the third reflection surface; and
- a lens group for directing the light reflected from the third reflection surface toward the fourth reflection surface, wherein the light reflected from the fourth reflection surface is incident onto the substrate positioned on the first stage.

16. The exposure apparatus according to claim 15, wherein the lens group comprises:
- a lens for focusing the light reflected from the third reflection surface; and
- a second reflection lens for reflecting the light having passed through the lens to the fourth reflection surface.

17. The exposure apparatus according to claim 16, further comprising a magnification adjusting mechanism provided along a light travel path between the second reflection member and the second reflection lens, for adjusting magnification.

18. The exposure apparatus according to claim 17, wherein the magnification adjusting mechanism comprises:
- a magnification adjusting lens provided between the second reflection member and the second reflection lens; and
- a transferring mechanism configured to transfer the magnification adjusting lens along an optical axis.

19. The exposure apparatus according to claim 18, wherein the transferring mechanism comprises a linear stepping motor.

20. The exposure apparatus according to claim 10, wherein the longitudinal axis of the intermediate optical system and the longitudinal axis of the projection optical system extend substantially parallel to the top surface of one of the first stage and the second stage.

21. The exposure apparatus according to claim 1, wherein the detecting mechanism comprises:
- a laser head provided in the frame member, for emitting laser beams;
- first and second mirrors for x-axis and y-axis measurement, fixed to two adjacent sides of the first stage, respectively;
- first interferometers provided to face the first and second mirrors, respectively;
- third and fourth mirrors for x-axis and y-axis measurement, fixed to two adjacent sides of the second stage, respectively; and
- second interferometers provided to face the third and fourth mirrors, respectively.

22. The exposure apparatus according to claim 21, further comprising a light travel path converting mechanism provided along a light travel path between the laser head and the first and second interferometers for transmitting the light emitted from the laser head to the first and second interferometers.

23. The exposure apparatus according to claim 1, further comprising an elastic member configured to suspend the first stage from the frame member.

24. The exposure apparatus according to claim 1, further comprising a supporting frame configured to support the frame member.

25. An exposure apparatus comprising:
- a supporting frame;
- a frame member supported on the supporting frame;
- a base member provided in the lower portion of the frame member;
- a first stage positioned on the base member and suspended from the frame member by an elastic member;
- a leveling mechanism provided between the base member and the first stage, the leveling mechanism being configured to adjust an orientation of the first stage with respect to the base member;
- a second stage positioned over the first stage and fixed to the frame member;
- an exposure area limiting mechanism positioned over the second stage, configured to limit an exposure area of the second stage;
- a light irradiating mechanism configured to irradiate light onto the first stage via the exposure area limiting mechanism and the second stage, the light irradiating mechanism including an intermediate optical system positioned between the exposure area limiting mechanism and the second stage, the intermediate optical system comprising:
  - a first reflection member positioned over the second stage and having a first reflection surface from which the light exiting the exposure area limiting mechanism is reflected, and a second reflection surface disposed at a predetermined angle with respect to the first reflection surface; and
  - a lens group for directing the light reflected from the first reflection surface toward the second reflection surface, wherein the light reflected from the second reflection surface is directed toward the second stage; and
- a detecting mechanism configured to detect an alignment of the first and second stages.

26. The exposure apparatus according to claim 25, further comprising a substrate positioned on the first stage so as to intercept the irradiated light and a reticle positioned on the second stage so as to intercept the irradiated light.

27. An exposure apparatus comprising:
- a supporting frame;
- a frame member supported on the supporting frame;
- a base member provided in the lower portion of the frame member;
- a first stage positioned on the base member and suspended from the frame member by an elastic member;
- a leveling mechanism provided between the base member and the first stage, the leveling mechanism being configured to adjust an orientation of the first stage with respect to the base member;
- a second stage positioned over the first stage and fixed to the frame member;
- an exposure area limiting mechanism positioned over the second stage, configured to limit an exposure area of the second stage;
- a light irradiating mechanism configured to irradiate light onto the first stage via the exposure area limiting mechanism and the second stage, the light irradiating mechanism including a projection optical system configured to irradiate light which passes through the second stage onto the first stage, the projection optical system comprising:
  - a first reflection member having a first reflection surface from which the light having passed through the second stage is reflected, and
  - a second reflection surface disposed at a predetermined angle with respect to the first reflection surface; and
  - a lens group for directing the light reflected from the first reflection surface toward the second reflection surface, wherein the light reflected from the second reflection surface is directed to the first stage; and
- a detecting mechanism configured to detect an alignment of the first and second stages.

28. The exposure apparatus according to claim 27, further comprising a substrate positioned on the first stage so as to intercept the irradiated light and a reticle positioned on the second stage so as to intercept the irradiated light.

* * * * *